United States Patent
Lee et al.

(10) Patent No.: US 7,086,456 B2
(45) Date of Patent: Aug. 8, 2006

(54) COMBINATION OF FAN AND HEAT SINK

(75) Inventors: Hsieh Kun Lee, Tu-chen (TW); DongYun Lee, Shenzhen (CN); Zhijie Zhang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 40 days.

(21) Appl. No.: 10/877,716

(22) Filed: Jun. 25, 2004

(65) Prior Publication Data

US 2004/0265121 A1 Dec. 30, 2004

(30) Foreign Application Priority Data

Jun. 25, 2003 (TW) .............. 92211552 U

(51) Int. Cl.
*H05K 7/20* (2006.01)
(52) U.S. Cl. .............. 165/121; 165/80.3; 165/185; 257/722; 361/697; 361/704
(58) Field of Classification Search .............. 165/80.3, 165/121, 122, 185; 174/16.3; 257/722; 361/697, 704
See application file for complete search history.

(56) References Cited

U.S. PATENT DOCUMENTS

| | | | | |
|---|---|---|---|---|
| 5,299,632 | A * | 4/1994 | Lee | 165/80.3 |
| 5,353,863 | A * | 10/1994 | Yu | 165/80.3 |
| 5,357,404 | A * | 10/1994 | Bright et al. | 361/704 |
| 5,677,829 | A * | 10/1997 | Clemens | 361/697 |
| 6,017,185 | A | 1/2000 | Kuo | |
| 6,301,113 | B1 * | 10/2001 | Guerrero | 361/704 |
| 6,308,773 | B1 * | 10/2001 | Lin | 165/80.3 |
| 6,341,644 | B1 * | 1/2002 | Lo et al. | 165/80.3 |
| 6,415,853 | B1 | 7/2002 | Tao et al. | |
| 6,459,584 | B1 | 10/2002 | Kuo | |
| 6,600,650 | B1 * | 7/2003 | Lee | 361/697 |
| 6,667,884 | B1 * | 12/2003 | Lee et al. | 361/697 |
| 6,896,046 | B1 * | 5/2005 | Lee et al. | 165/185 |
| 2002/0189789 | A1* | 12/2002 | Lin | 165/80.3 |
| 2003/0161107 | A1* | 8/2003 | Segala | 361/704 |

FOREIGN PATENT DOCUMENTS

TW 501870 9/2002

* cited by examiner

*Primary Examiner*—Leonard R. Leo

(74) *Attorney, Agent, or Firm*—Wei Te Chung

(57) ABSTRACT

A combination of fan and heat sink includes a fan (10), a heat sink (20) and four fixtures (30). The fan defines four holes (12) in four corners thereof respectively. The heat sink has a plurality of parallel fins (24). Each fixture includes a post (32) inserted into the corresponding hole of the fan, a pressing portion (36) pressing the fan toward the heat sink and a locking leg (34) interlocking with outmost fins.

12 Claims, 3 Drawing Sheets

COMBINATION OF FAN AND HEAT SINK

BACKGROUND OF THE INVENTION

1. Field of the Invention

The present invention relates to heat dissipation assemblies, and more particularly to a combination of fan and heat sink for dissipating heat from electronic components.

2. Description of Prior Art

Electronics technology continues to boom unabated. Numerous modem electronic components such as central processing units (CPUs) of computers operate at high speed and thus generate large amounts of heat. The heat must be efficiently removed from the CPU; otherwise, abnormal operation or damage may result. Typically, a heat sink with good thermal conducting capability is mounted onto the CPU, and a fan is mounted onto the heat sink to enhance the heat dissipation capability thereof.

Most commonly, a fan is locked onto a heat sink by screws interferentially engaged with fins of the heat sink. Locking by this means is unduly laborious and slow. Additionally, the fins of the heat sink are generally thin and are liable to be deflected. Thus, the screws may loosen from the fins. The fan is liable to operate less efficiently, and may even become unserviceable.

To overcome the problems of the above-mentioned heat dissipation assembly, Taiwan Patent No. 511833 provides another kind of heat dissipation assembly. A fan is secured to a fan holder by screws. The combined fan and fan holder are then placed on a heat sink. However, screws are still needed. Locking the fan to the fan holder by this means is still laborious and slow.

SUMMARY OF THE INVENTION

Accordingly, an object of the present invention is to provide a combination of fan and heat sink which can be conveniently and safely assembled.

In order to achieve the object set out above, a combination of fan and heat sink in accordance with a preferred embodiment of the present invention comprises a fan, a heat sink and four fixtures. The fan defines four holes in four corners thereof respectively. The heat sink has a plurality of parallel fins. Each fixture comprises a post inserted into the corresponding hole of the fan, a pressing portion pressing the fan toward the heat sink and a locking leg interlocking with outmost fins.

Other objects, advantages and novel features of the present invention will become more apparent from the following detailed description when taken in conjunction with the accompanying drawings, in which:

DETAILED DESCRIPTION OF THE INVENTION

Figure 1:
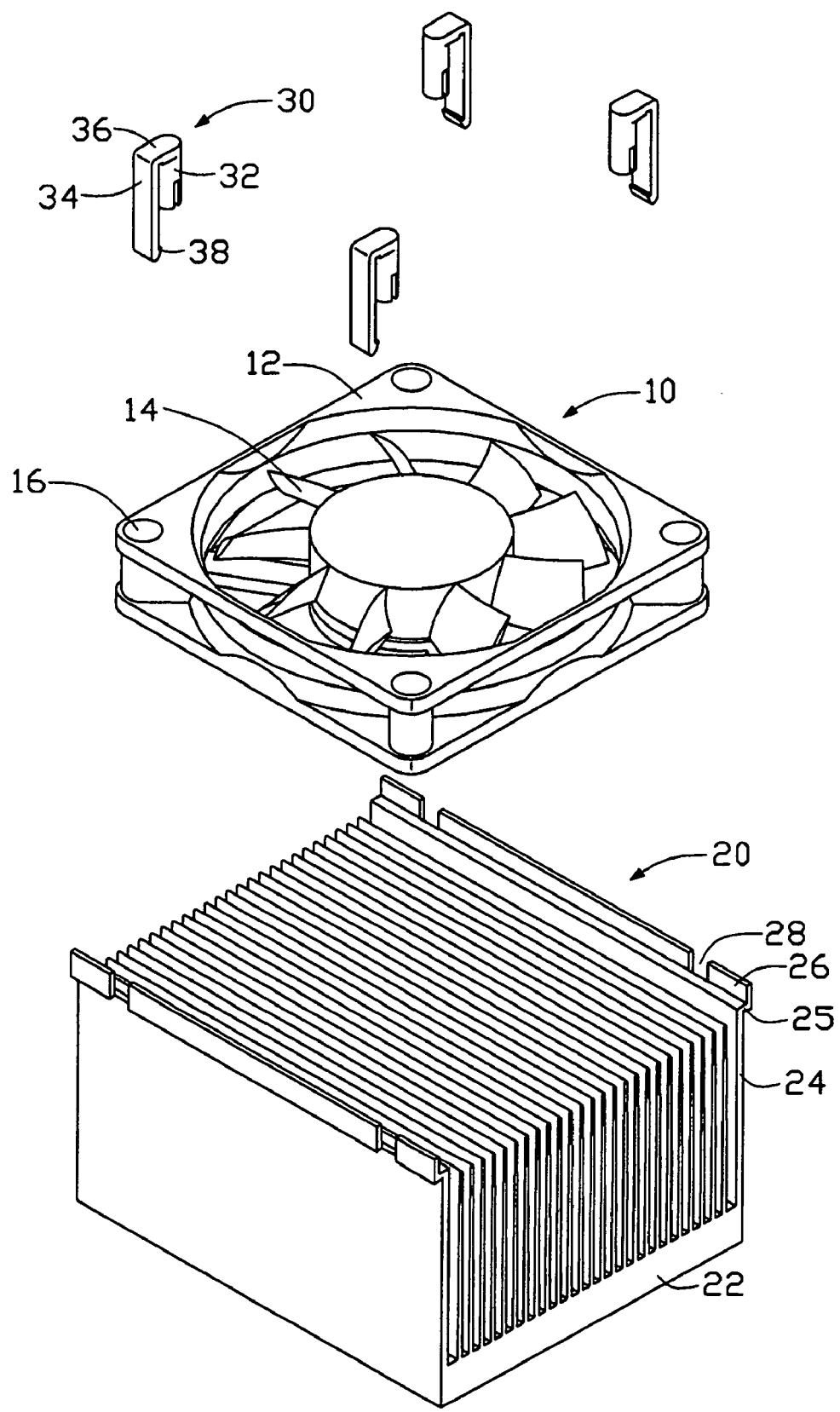
FIG. 1 is an exploded, isometric view of a combination of fan and heat sink in accordance with the preferred embodiment of the present invention.

Referring to FIG. 1, a combination of fan and heat sink in accordance with the preferred embodiment of the present invention comprises a fan 10, a heat sink 20 and four fixtures 30 to fasten the fan 10 to the heat sink 20.

The fan 10 comprises a rectangular frame 12, a plurality of blades 14. Four positioning holes 16 are defined in four corners of the rectangular frame 12 respectively.

The heat sink 20 comprises a base 22 and a plurality of parallel spaced fins 24 extending perpendicularly from the base 22. The outmost two fins 24 are slightly higher than the inner fins 24. A support 25 extends horizontally and outwardly from a top of each outmost fin 24. A flange 26 is formed perpendicularly and upwardly from an outmost edge of each support 25. A pair of cutouts 28 is separately defined in each flange 26 and divides the corresponding flange 26 in three segments.

Each fixture 30 comprises a post 32, a pressing portion 36 and a locking leg 34. The post 32 and the locking leg 34 extend perpendicularly downwardly from opposite ends of the pressing portion 36. An inner hook 38 is formed at a bottom of each locking leg 34.

Figure 2:
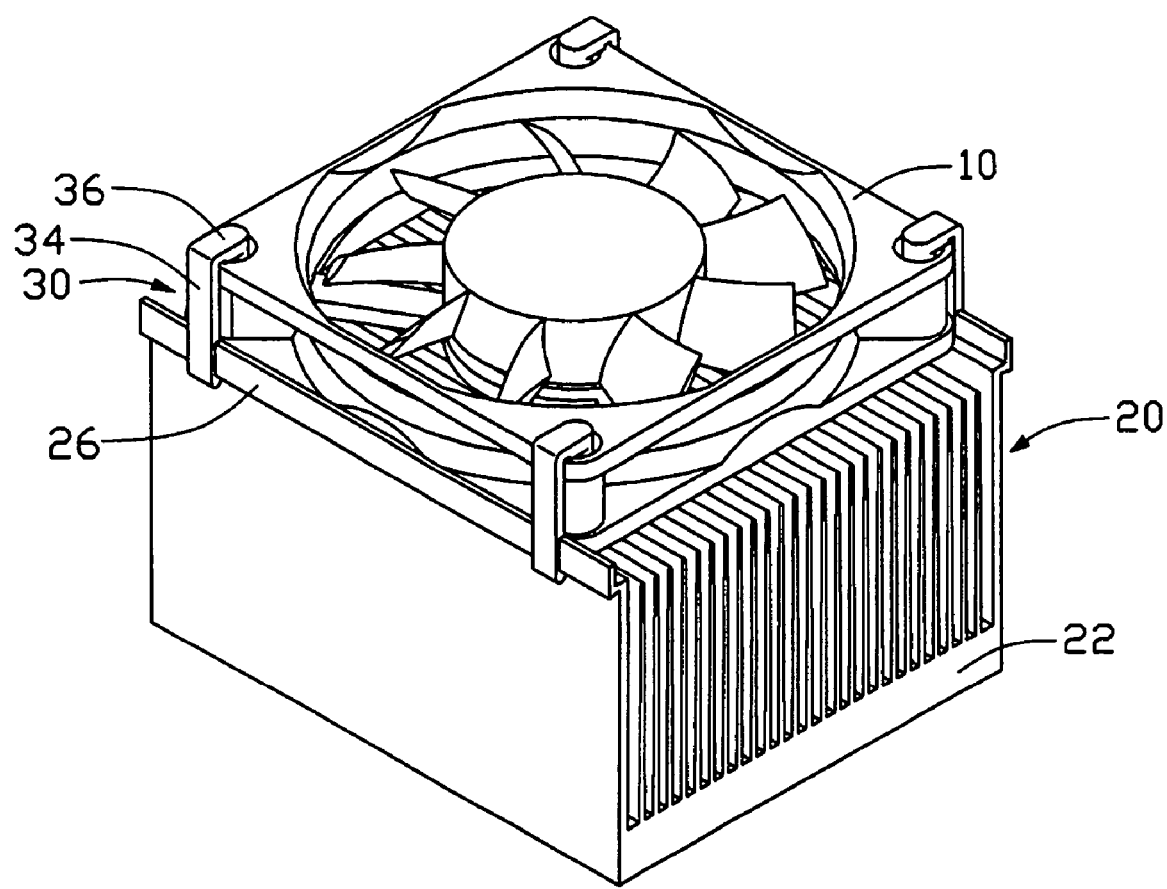
FIG. 2 is an assembled view of FIG. 1.
Figure 3:
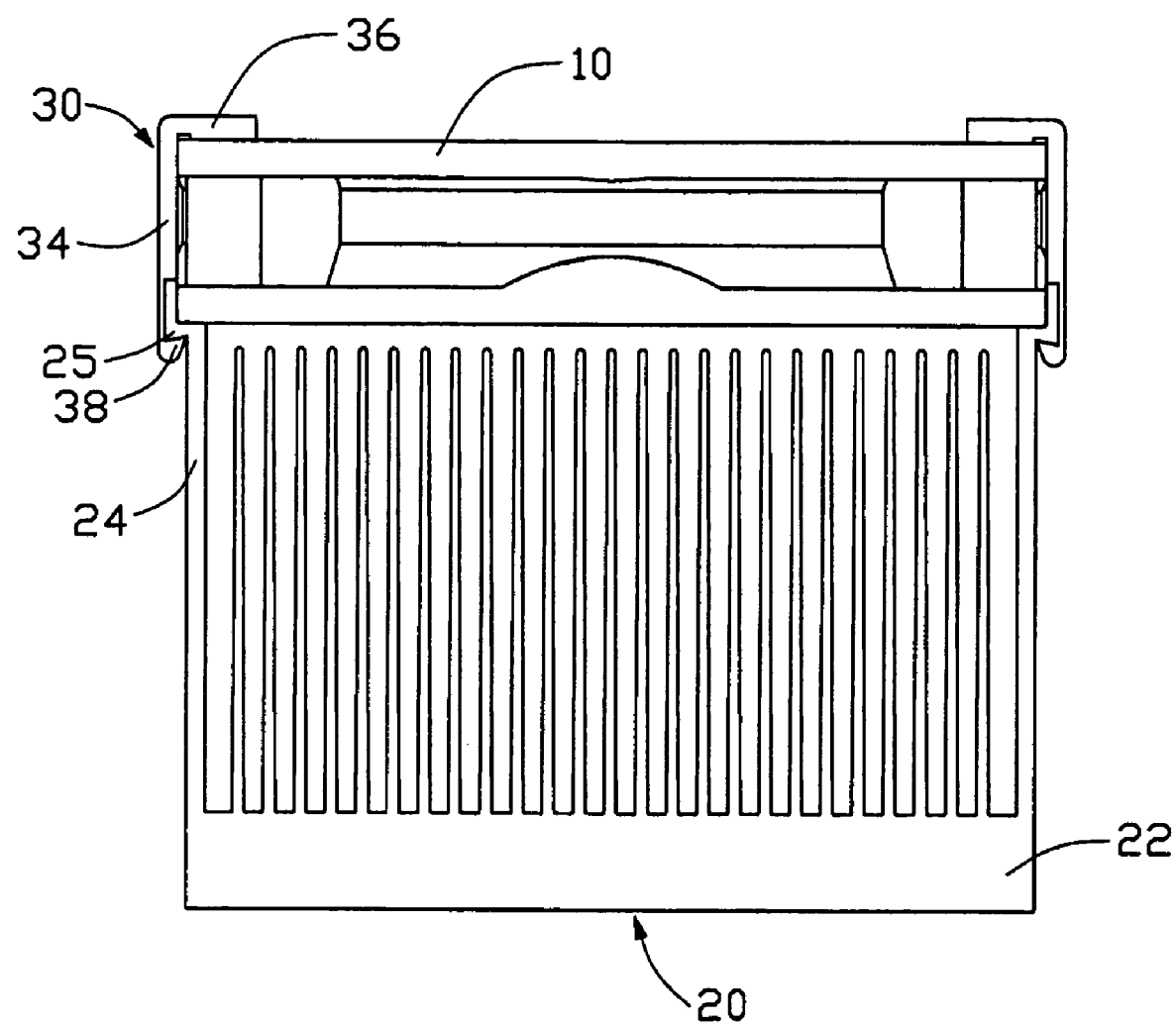
FIG. 3 is a side elevation of FIG. 2.

Referring also to FIGS. 2–3, in assembly of the combination of fan and heat sink, the fan 10 is placed on the heat sink 20 and supported on the supports 25 between the flanges 26. The posts 32 of the fixtures 30 are inserted into the positioning holes 16, respectively. Simultaneously, the locking legs 34 are lodged in the cutouts 28. Then, the pressing portions 36 are pressed to the frame 12 of the fan 10. The hooks 38 of the fixtures 30 ride over the flanges 26 in the cutouts 28 respectively and interlock with the supports 25. Thus, the fan 10 is mounted on the heat sink 20 in all directions.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A combination of fan and heat sink comprising:
    a fan defining two holes thereof respectively;
    a heat sink having a plurality of fins; and
    two fixtures, each of the fixtures comprising a post inserted into a corresponding hole of the fan, a pressing portion pressing the fan toward the heat sink and a locking leg interlocking with one of the fins, each locking leg forming an inner hook thereon;
    wherein a support extends horizontally outwardly from each of outmost fins of the heat sink, and wherein the fan is mounted on the supports and the hooks interlock with the supports.

2. The combination of claim 1, wherein the post and the locking leg extend perpendicularly from opposite ends of the pressing portion of each of the fixtures.

3. The combination of claim 1, wherein a flange extends perpendicularly upwardly from each support.

4. The combination of claim 3, wherein a cutout is defined in each flange, and wherein the locking legs are received in the cutouts.

5. The combination of claim 4, wherein the fan is rectangular, and wherein the holes are defined in two diagonal corners of the fan.

6. The combination of claim 4, wherein the heat sink comprises a base, and wherein the fins extend perpendicularly from the base.

7. The combination of claim 1, wherein the fan is mounted on tops of the supports and the hooks interlock with bottoms of the supports.

8. A combination comprising:
a heat sink having a plurality of fins providing cutouts, a support extending horizontally outwardly from each of outmost fins of the heat sink, a flange extending perpendicularly upwardly from each support, the cutouts being defined in the flanges;
a fan placed on the supports of the heat sink and between the flanges; and
two fixtures cooperating with the fins to securely sandwich the fan therebetween in a direction, each of the fixtures comprising a locking leg engaged in a corresponding cutout and interlocking with the support to locate the fan relative to the heat sink in a plane perpendicular to said direction.

9. The combination of claim 8, wherein the fan defines two holes, and each of the fixtures further comprises a post received in a corresponding hole of the fan.

10. The combination of claim 8, wherein each locking leg forms an inner hook engaged with a bottom of the support.

11. A combination of fan and heat sink comprising:
a fan defining two holes thereof respectively;
a heat sink having a plurality of fins extending in a vertical direction with cutouts thereof, a support extending horizontally outwardly from each of outmost fins of the heat sink, the fan being placed on the supports, a flange extending perpendicularly upwardly from each support, the cutouts being defined in the flanges; and
two fixtures, each of the fixtures comprising a post downwardly inserted into a corresponding hole of the fan and a leg not only received in the corresponding cutout but also hooked by the support so as to have both the fixture and the fan unable to move relative to the heat sink.

12. The combination of claim 11, wherein the fan is mounted on tops of the supports, and the legs are hooked by bottoms of the supports.

* * * * *